(12) United States Patent
Watanabe et al.

(10) Patent No.: US 9,947,555 B2
(45) Date of Patent: Apr. 17, 2018

(54) SEMICONDUCTOR MANUFACTURING APPARATUS AND METHOD OF MANUFACTURING SEMICONDUCTOR DEVICE

(71) Applicant: Toshiba Memory Corporation, Minato-ku (JP)

(72) Inventors: Takashi Watanabe, Yokkaichi (JP); Takayuki Nakayama, Yokkaichi (JP); Jun Takayasu, Yokkaichi (JP)

(73) Assignee: TOSHIBA MEMORY CORPORATION, Minato-ku (JP)

( * ) Notice: Subject to any disclaimer, the term of this patent is extended or adjusted under 35 U.S.C. 154(b) by 0 days.

(21) Appl. No.: 15/012,946

(22) Filed: Feb. 2, 2016

(65) Prior Publication Data

US 2017/0040189 A1 Feb. 9, 2017

(30) Foreign Application Priority Data

Aug. 6, 2015 (JP) .................. 2015-155853

(51) Int. Cl.
*H01L 21/67* (2006.01)
*H01L 21/02* (2006.01)
*H01L 21/687* (2006.01)

(52) U.S. Cl.
CPC .. *H01L 21/67046* (2013.01); *H01L 21/02041* (2013.01); *H01L 21/67051* (2013.01); *H01L 21/68728* (2013.01)

(58) Field of Classification Search
CPC ......... H01L 21/67046; H01L 21/68728; H01L 21/02057; H01L 21/02041

(Continued)

(56) References Cited

U.S. PATENT DOCUMENTS 6,550,091 B1 * 4/2003 Radman ............... B08B 1/04
15/102
7,252,099 B2 * 8/2007 Chen .................... B08B 3/02
134/103.2

(Continued)

FOREIGN PATENT DOCUMENTS

JP 2002-313767 A * 10/2002 ........... H01L 21/304
JP 2009-26947 2/2009

(Continued)

OTHER PUBLICATIONS

Computer generated English translation of JP 2002-313767A, Ito et al, Oct. 2002.*

*Primary Examiner* — Laura C Guidotti
(74) *Attorney, Agent, or Firm* — Oblon, McClelland, Maier & Neustadt, L.L.P.

(57) ABSTRACT

In one embodiment, a semiconductor manufacturing apparatus includes a wafer retaining module configured to retain a wafer by a chuck pin and to rotate the wafer. The apparatus further includes a wafer cleaning module configured to retain a cleaning member for cleaning a surface of the wafer and to rotate the cleaning member around a first rotation axis that is perpendicular to the surface of the wafer, the wafer cleaning module cleaning the surface of the wafer by moving the cleaning member on the surface of the wafer while the cleaning member contacts the wafer and rotates. The wafer cleaning module retains and rotates the cleaning member so that the first rotation axis does not pass through a contact region of the cleaning member with respect to the wafer.

11 Claims, 8 Drawing Sheets

(58) Field of Classification Search
USPC .................................. 15/102, 88.2–88.4, 77
See application file for complete search history.

(56) References Cited

U.S. PATENT DOCUMENTS

| | | | |
|---|---|---|---|
| 8,578,953 B2 | 11/2013 | Takiguchi et al. | |
| 2002/0189641 A1* | 12/2002 | Sato | B08B 1/04 134/6 |
| 2008/0263793 A1* | 10/2008 | Nakano | B08B 1/04 15/77 |

FOREIGN PATENT DOCUMENTS

| | | |
|---|---|---|
| JP | 2009-59750 | 3/2009 |
| JP | 2013-206983 | 10/2013 |
| JP | 2014-17499 | 1/2014 |
| JP | 5470746 | 4/2014 |

* cited by examiner

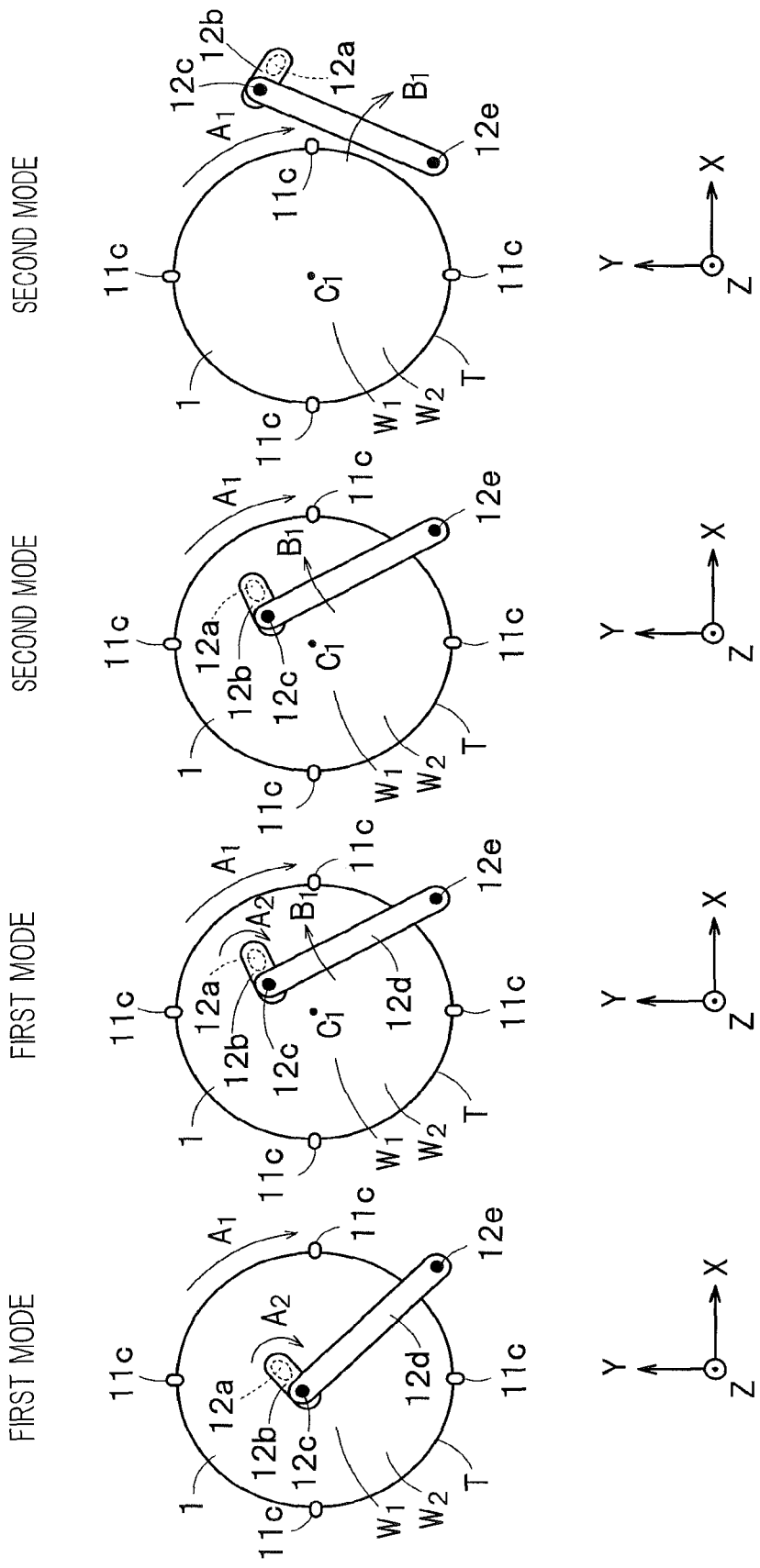

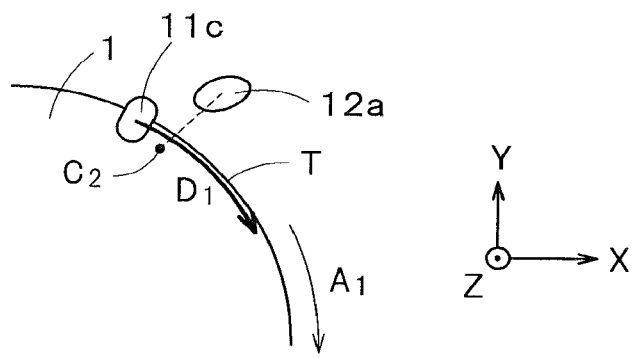
F I G. 5A
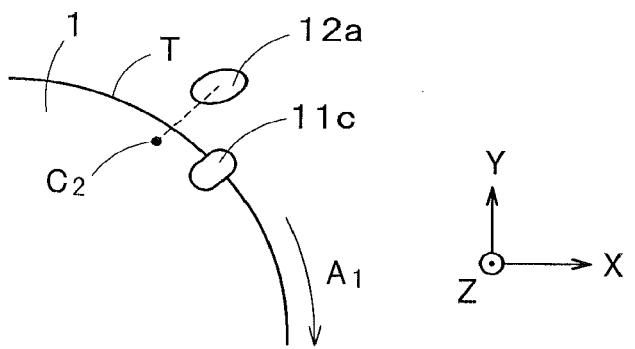
F I G. 5B
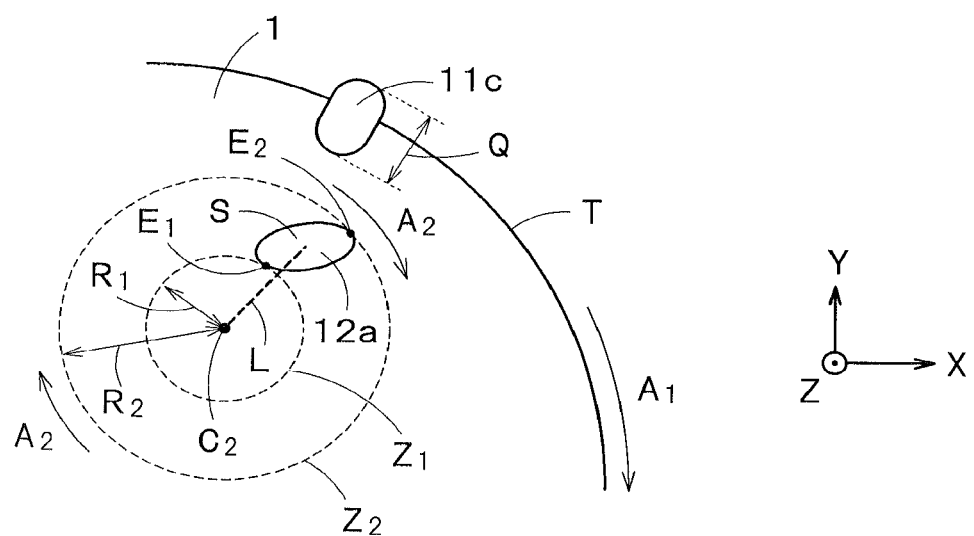
F I G. 6

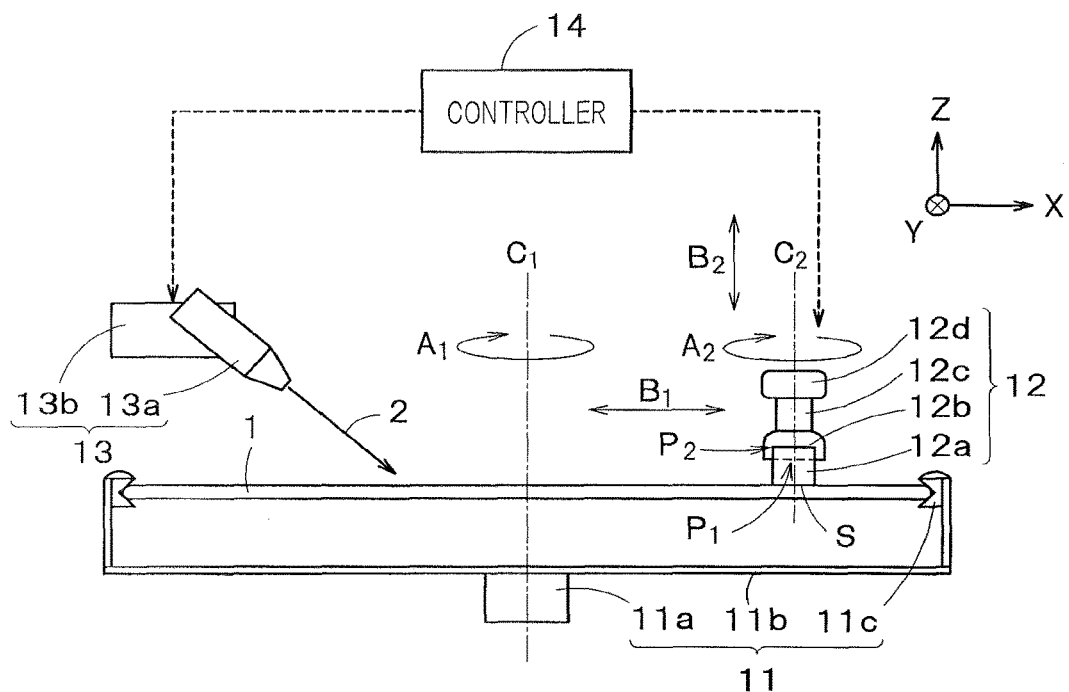
F I G. 7A
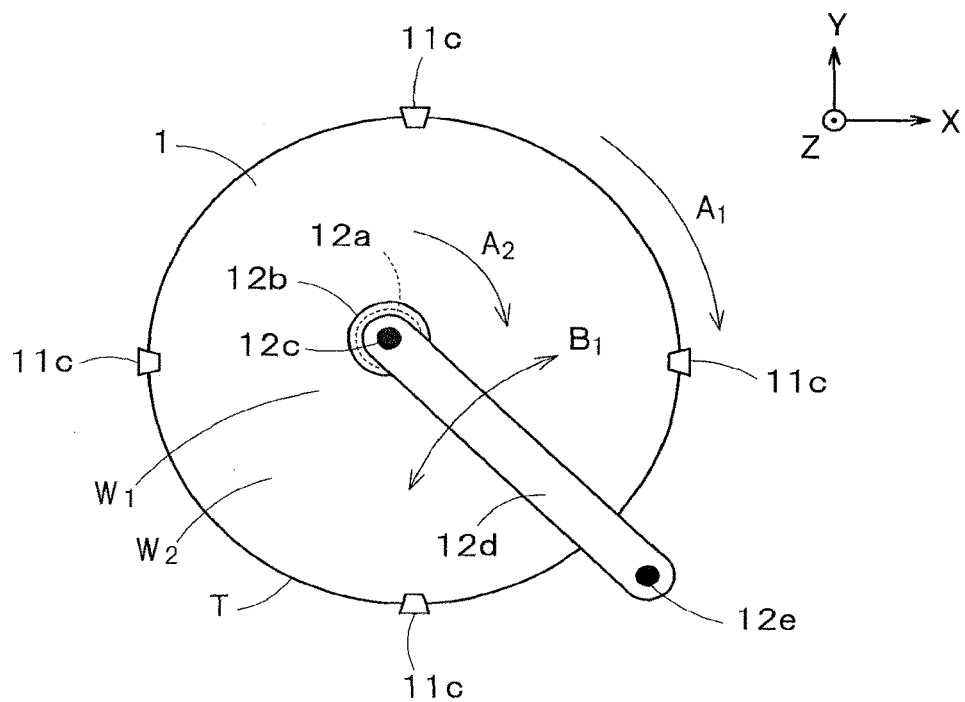
F I G. 7B

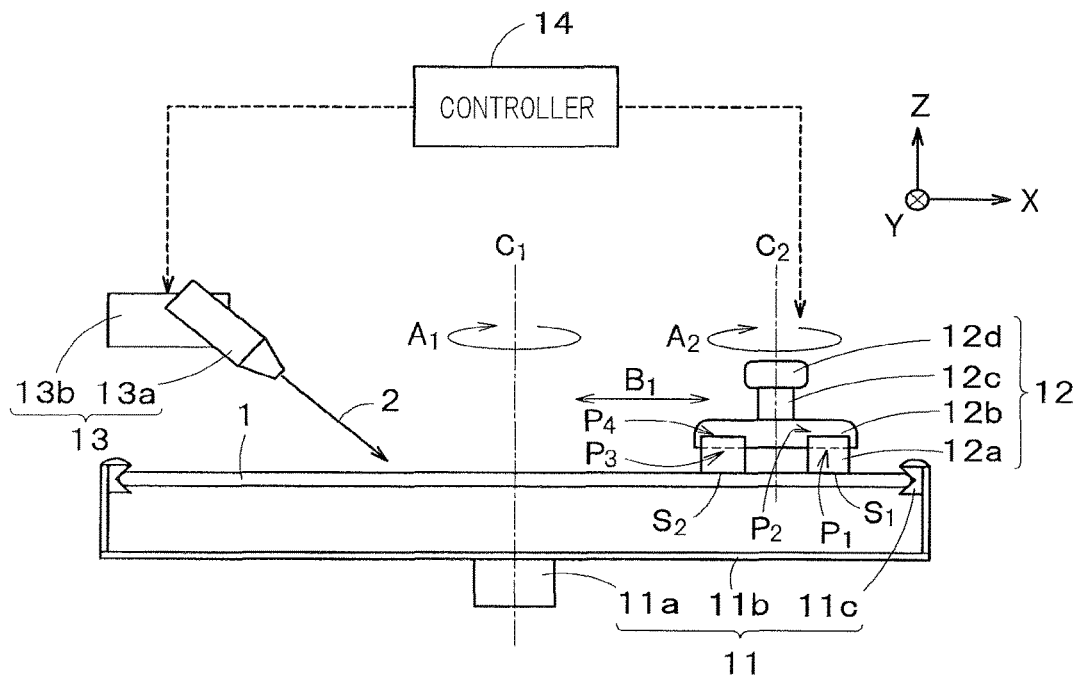
F I G. 8A
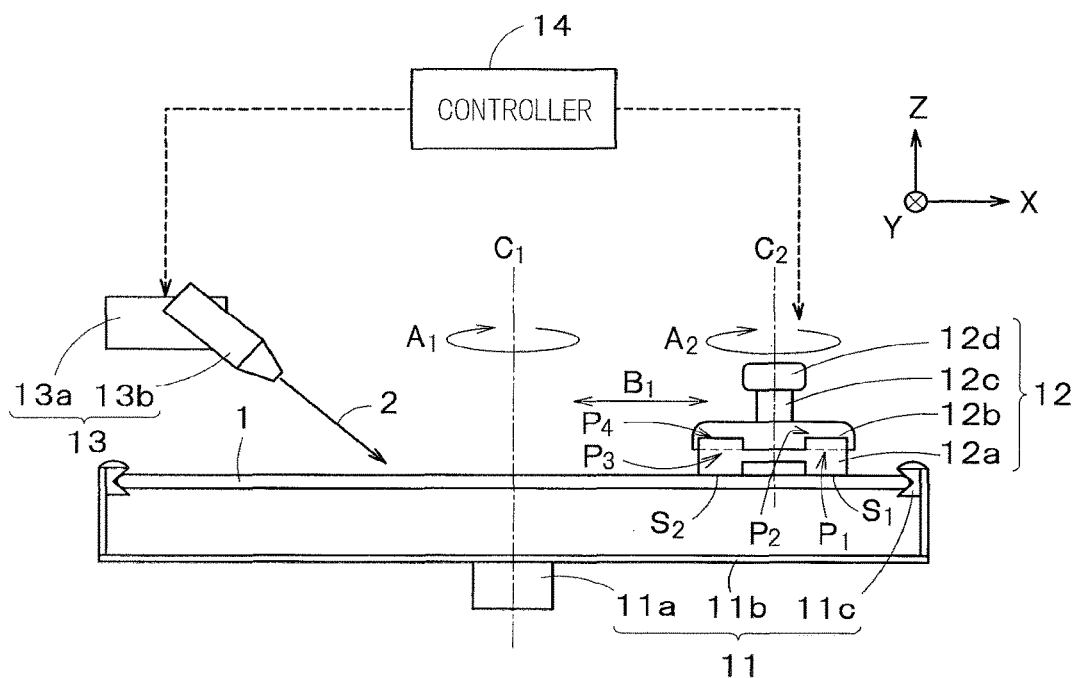
F I G. 8B

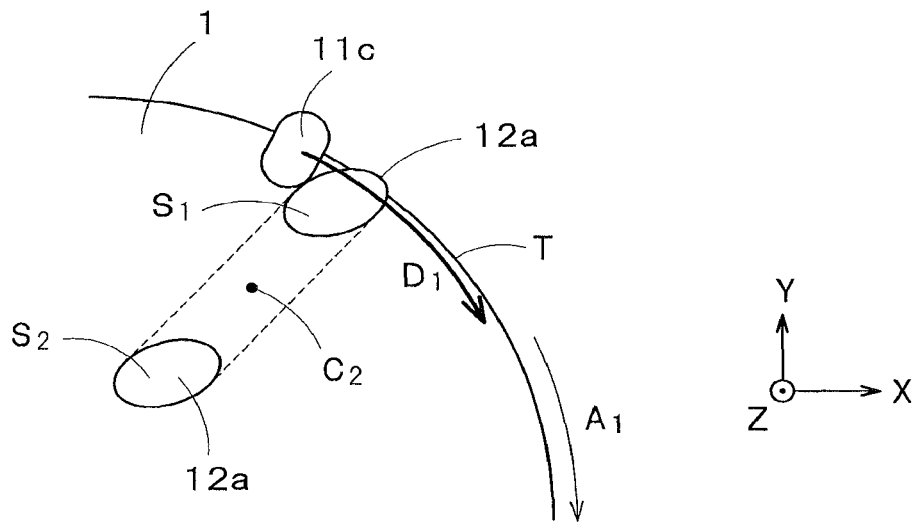
F I G. 9A
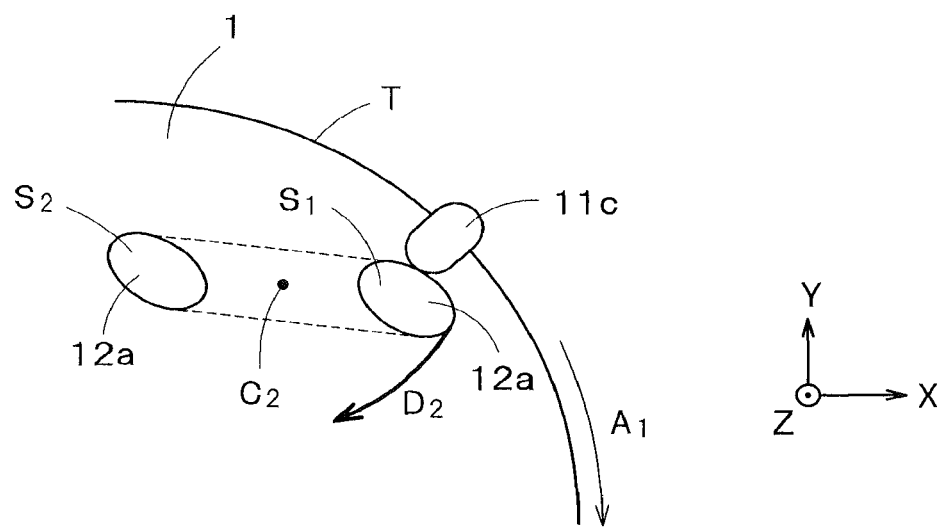
F I G. 9B

SEMICONDUCTOR MANUFACTURING APPARATUS AND METHOD OF MANUFACTURING SEMICONDUCTOR DEVICE

CROSS REFERENCE TO RELATED APPLICATION

This application is based upon and claims the benefit of priority from the prior Japanese Patent Application No. 2015-155853, filed on Aug. 6, 2015, the entire contents of which are incorporated herein by reference.

FIELD

Embodiments described herein relate to a semiconductor manufacturing apparatus and a method of manufacturing a semiconductor device.

BACKGROUND

The types of brush cleaning of a semiconductor wafer include roll-brush cleaning and pen-brush cleaning (sweep-brush cleaning). In the roll-brush cleaning, the wafer is cleaned by sandwiching the wafer by brushes having roll shapes from both faces of the wafer, and rotating the wafer and the brushes. In the pen-brush cleaning, the wafer is cleaned by bringing a brush having a pen shape into contact with a face of the wafer, and sweeping the face of the wafer by the brush while rotating the wafer and the brush.

The pen-brush cleaning has an advantage that the rotating speed of the wafer can be easily increased. Therefore, in the pen-brush cleaning, the relative speed of the wafer and the brush upon cleaning can be increased compared with the roll-brush cleaning, and the cleaning performance of the wafer can be increased.

However, the pen-brush cleaning has the following problems. In order to rotate the wafer at high speed in the pen-brush cleaning, the wafer has to be chucked by chuck pins in the vicinities of the circumference of the wafer. However, if the brush and a chuck pin contact each other, the brush may fall or the rotation of the wafer may be stopped. Therefore, the wafer cannot be cleaned to the circumference, and the brush has to be pulled up at a wafer circumferential portion in the vicinity of the circumference after the cleaning is finished. Therefore, there are problems that foreign matters remain on the wafer circumferential portion and the foreign matters attached to the brush are reattached to the wafer upon pull-up of the brush.

BRIEF DESCRIPTION OF THE DRAWINGS

FIGS. 2A to 2D are top views showing an operation of the semiconductor manufacturing apparatus of the first embodiment;

FIGS. 5A and 5B are top views showing an example of avoidance of contact between the brush and the chuck pins of the first embodiment;

FIG. 6 is a top view for explaining shapes of the brush and the chuck pins of the first embodiment;

FIGS. 7A and 7B are a cross sectional view and a top view showing a structure of a semiconductor manufacturing apparatus of a comparative example of the first embodiment;

FIGS. 8A and 8B are cross sectional views showing structures of semiconductor manufacturing apparatuses of a second embodiment;

FIGS. 9A and 9B are top views showing an example of contact between brushes and chuck pins of the second embodiment.

DETAILED DESCRIPTION

Embodiments will now be explained with reference to the accompanying drawings.

In one embodiment, a semiconductor manufacturing apparatus includes a wafer retaining module configured to retain a wafer by a chuck pin and to rotate the wafer. The apparatus further includes a wafer cleaning module configured to retain a cleaning member for cleaning a surface of the wafer and to rotate the cleaning member around a first rotation axis that is perpendicular to the surface of the wafer, the wafer cleaning module cleaning the surface of the wafer by moving the cleaning member on the surface of the wafer while the cleaning member contacts the wafer and rotates. The wafer cleaning module retains and rotates the cleaning member so that the first rotation axis does not pass through a contact region of the cleaning member with respect to the wafer.

First Embodiment

Figure 1A:
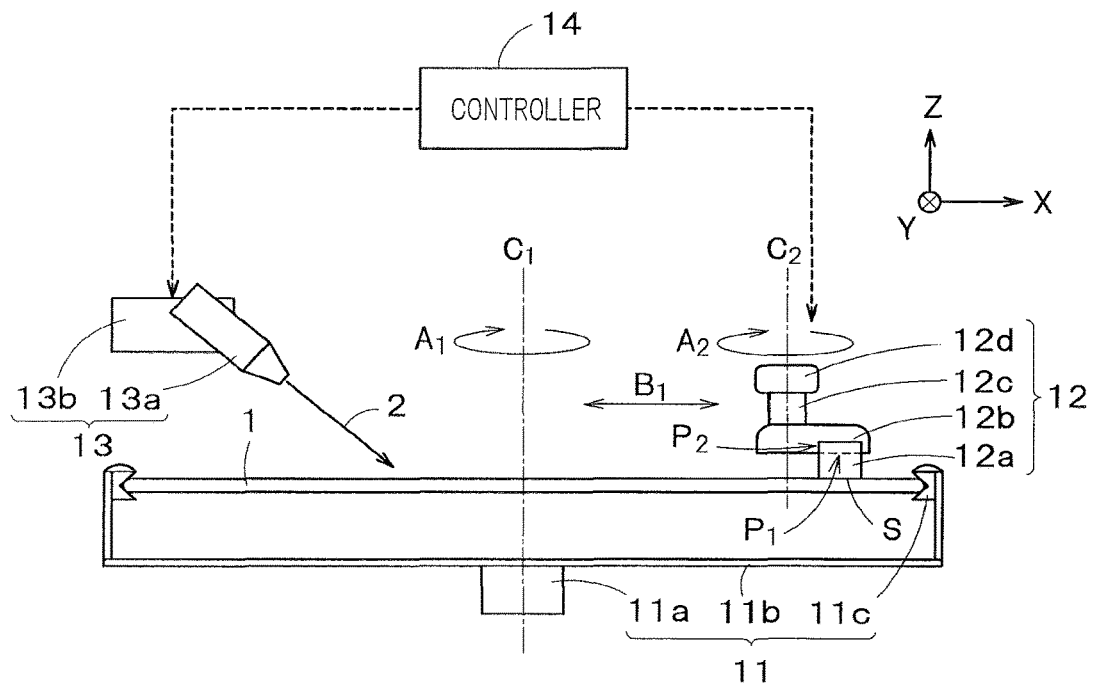
FIGS. 1A and 1B are a cross sectional view and a top view showing a structure of a semiconductor manufacturing apparatus of a first embodiment.
Figure 1B:
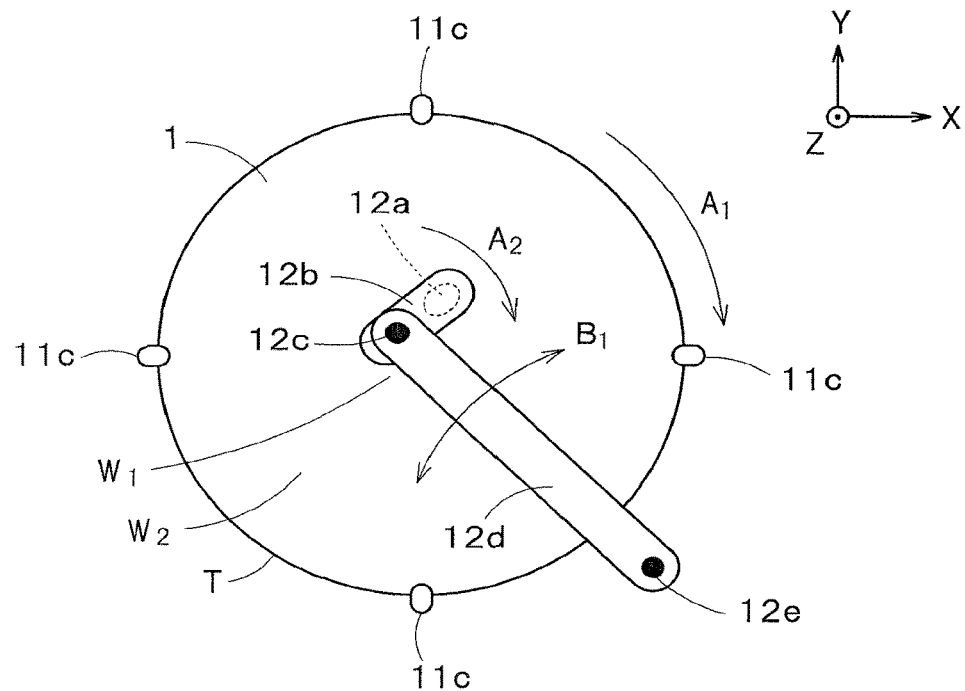

FIGS. 1A and 1B are a cross sectional view and a top view showing a structure of a semiconductor manufacturing apparatus of a first embodiment.

The semiconductor manufacturing apparatus of the present embodiment includes a wafer retaining module 11 that retains a wafer 1 as a cleaning target, a wafer cleaning module 12 that cleans a surface of the wafer 1 with a cleaning liquid 2, and a cleaning-liquid supplying module 13 that supplies the cleaning liquid 2 to the surface of the wafer 1. The semiconductor manufacturing apparatus of the present embodiment further includes a controller 14 that controls operations of the wafer retaining module 11, the wafer cleaning module 12, the cleaning-liquid supplying module 13 and the like.

An example of the wafer 1 is a semiconductor wafer. The wafer 1 of the present embodiment is used for manufacturing a semiconductor device from the wafer 1. FIGS. 1A and 1B show an "X" direction and a "Y" direction that are parallel to the surface of the wafer 1 and are perpendicular to each other, and a "Z" direction that is perpendicular to the surface of the wafer 1. In the present specification, a "+Z" direction is considered as an upward direction, and a "−Z" direction is considered as a downward direction. The "−Z" direction of the present embodiment may match the direction of gravity or may not match the direction of gravity.

A symbol "T" shows a circumference of the wafer 1 (FIG. 1B). A region on the surface of the wafer 1 is roughly divided into a wafer central portion "$W_1$" that is close to the center of the wafer 1, and a wafer circumferential portion "$W_2$" that is close to the circumference "T" of the wafer 1. In the present embodiment, the wafer central portion "$W_1$" is cleaned first, and the wafer circumferential portion "$W_2$"

is then cleaned. The wafer central portion "$W_1$" is an example of a first portion. The wafer circumferential portion "$W_2$" is an example of a second portion.

The wafer retaining module 11 includes a rotation portion 11a, a stage 11b, and chuck pins 11c. The wafer 1 is physically retained by the chuck pins 11c in the vicinity of the circumference "T". The chuck pins 11c are attached to the stage 11b. The stage 11b is attached to the rotation portion 11a. The wafer retaining module 11 can rotate the wafer 1 retained with the chuck pins 11c by rotating the stage 11b with the rotation portion 11a.

A symbol "$C_1$" represents a rotation axis of the wafer 1 and the rotation portion 11a. The wafer 1 and the rotation portion 11a rotate around the rotation axis "$C_1$" as shown by an arrow "$A_1$". The rotation axis "$C_1$" of the present embodiment is parallel to the "Z" direction and passes through the center of the wafer 1.

The wafer cleaning module 12 includes a rotation portion 12b retaining a brush 12a, a first connecting portion 12c, an arm portion 12d, and a second connecting portion 12e. The brush 12a of the present embodiment is a pen-shaped sponge brush and is used for cleaning the wafer 1 by pen-brush cleaning. The brush 12a is attached to the rotation portion 12b by inserting an upper portion "$P_1$" of the brush 12a into an opening "$P_2$" of the rotation portion 12b. The brush 12a is detachable from and attachable to the rotation portion 12b. The brush 12a is an example of a cleaning member (cleaning component).

The rotation portion 12b is fixed to the first connecting portion 12c, and the first connecting portion 12c is rotatably attached to the arm portion 12d. Therefore, the rotation portion 12b can be rotated around the first connecting portion 12c. As a result, the rotation portion 12b can rotate the brush 12a around the first connecting portion 12c.

A symbol "$C_2$" represents a rotation axis of the brush 12a, the rotation portion 12b and the first connecting portion 12c. The brush 12a, the rotation portion 12b and the first connecting portion 12c are rotated around the rotation axis "$C_2$" as shown by an arrow "$A_2$". The rotation axis "$C_2$" of the present embodiment is parallel to the "Z" direction and passes through the center of the first connecting portion 12c. The rotation axis "$C_2$" is an example of a first rotation axis.

A symbol "S" represents a contact region of the brush 12a with respect to the wafer 1. The contact region "S" of the present embodiment corresponds to a bottom surface of the brush 12a. The wafer cleaning module 12 of the present embodiment retains and rotates the brush 12a so that the rotation axis "$C_2$" does not pass through the contact region "S". FIG. 1A shows a state in which the rotation axis "$C_2$" is not passing through the contact region "S". Reasons of employing such a structure will be described later.

The arm portion 12d is connected to the rotation portion 12b via the first connecting portion 12c. The arm portion 12d is fixed to the second connecting portion 12e, and the second connecting portion 12e is rotatably attached to a main body portion (not shown) of the wafer cleaning module 12. Therefore, the arm portion 12d and the second connecting portion 12e can be rotated around the second connecting portion 12e as shown by an arrow "$B_1$". As a result, the arm portion 12d can move the first connecting portion 12c, the rotation portion 12b, and the brush 12a.

When the semiconductor manufacturing apparatus of the present embodiment is to clean the wafer 1, the semiconductor manufacturing apparatus brings the brush 12a into contact with the surface of the wafer 1 while rotating the wafer 1 and the brush 12a. Then, the semiconductor manufacturing apparatus rotates the arm portion 12d while the wafer 1 and the brush 12a contact with each other and rotate, thereby moving the brush 12a on the surface of the wafer 1. As a result, the surface of the wafer 1 can be swept by the brush 12a, and the surface of the wafer 1 can be cleaned by the brush 12a.

The cleaning-liquid supplying module 13 includes a cleaning-liquid nozzle 13a that discharges the cleaning liquid 2, and a nozzle driving portion 13b that moves the cleaning-liquid nozzle 13a. The cleaning-liquid supplying module 13 can discharge the cleaning liquid 2 to a desired position on the wafer 1 by moving the cleaning-liquid nozzle 13a by the nozzle driving portion 13b.

The controller 14 controls, for example, the rotations of the rotation portion 11a, the rotation portion 12b and the arm portion 12d, the discharging operations of the cleaning-liquid nozzle 13a, the moving operations of the nozzle driving portion 13b and the like.

The controller 14 of the present embodiment can set the wafer cleaning module 12 to either one of a first mode and a second mode. In the first mode, the wafer cleaning module 12 rotates the brush 12a by the rotation portion 12b. In other words, the brush 12a is intentionally rotated in the first mode. In the second mode, the wafer cleaning module 12 stops the rotation of the brush 12a by the rotation portion 12b so that the brush 12a is rotated by the force from outside of wafer cleaning module 12. In other words, intentional rotations of the brush 12a are stopped, and the brush 12a is caused to be in a state in which the brush 12a can be rotated by an action such as collision, friction and the like in the second mode.

Such control can be realized, for example, by on/off of a motor that subjects the rotation portion 12b to rotary drive. In the first mode, the controller 14 turns on the motor and rotates the rotation portion 12b by the motor. In the second mode, the controller 14 turns off the motor and stops the rotation of the rotation portion 12b by the motor.

In the second mode of the present embodiment, the brush 12a is caused to be in a state in which the brush 12a can be freely rotated. Therefore, when the brush 12a collides with a chuck pin 11c, the brush 12a is freely rotated by this collision. Details of such operation will be described later.

FIGS. 2A to 2D are top views showing an operation of the semiconductor manufacturing apparatus of the first embodiment.

When the wafer 1 is to be cleaned, the semiconductor manufacturing apparatus of the present embodiment first brings the brush 12a into contact with the surface of the wafer 1 in the vicinity of the center thereof while rotating the wafer 1 (FIG. 2A). In this process, the wafer cleaning module 12 is set to the first mode. Therefore, the brush 12a is rotated by the force from the rotation portion 12b.

Next, the arm portion 12d is rotated so as to move the brush 12a from the wafer central portion "$W_1$" to the wafer circumferential portion "$W_2$" (FIG. 2B). As a result, the wafer central portion "$W_1$" is cleaned by the brush 12a of the first mode. Before the brush 12a reaches the circumference "T" of the wafer 1, the controller 14 switches the wafer cleaning module 12 from the first mode to the second mode (FIG. 2C). As a result, the brush 12a becomes a state in which the brush 12a can be freely rotated. The arm portion 12d is then rotated so as to move the brush 12a toward the circumference "T". As a result, the wafer circumferential portion "$W_2$" is cleaned by the brush 12a of the second mode.

In the second mode, the arm portion 12d moves the brush 12a from the inner side to the outer side of the circumference "T" of the wafer 1, thereby detaching the brush 12a from the surface of the wafer 1 (FIG. 2D). In other words, the arm portion 12d detaches the brush 12a from the wafer 1 by moving the brush 12a in a horizontal direction instead of pulling up the brush 12a to the upper side. Therefore, according to the present embodiment, the wafer 1 can be cleaned to the circumference "T", and foreign matters attached to the brush 12a can be prevented from being reattached to the wafer 1.

In the operation of FIG. 2D, since the chuck pins 11c are present on the surface of the wafer 1, the brush 12a may contact the chuck pins 11c. Details thereof will be explained with reference to FIG. 3A to FIG. 5B.

Figure 3A:
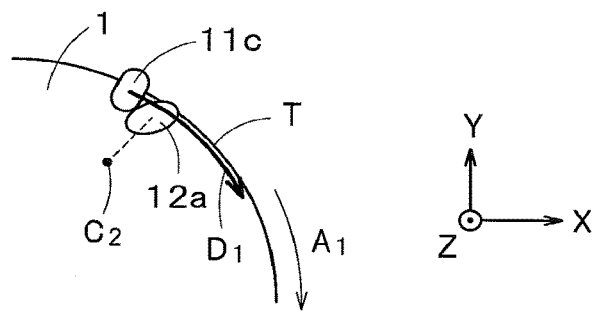
FIGS. 3A and 3B are top views showing an example of contact between a brush and chuck pins of the first embodiment.
Figure 3B:
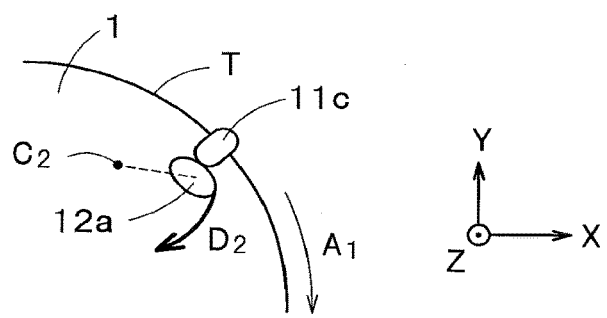

FIGS. 3A and 3B are top views showing an example of contact between the brush 12a and the chuck pins 11c of the first embodiment.

FIG. 3A shows a case where the brush 12a contacts a chuck pin 11c as shown by an arrow "$D_1$" when the brush 12a of the second mode is moved in the vicinity of the circumference "T". In FIG. 3A, when the rotation axis "$C_2$" of the brush 12a is in the inner side of the circumference "T", the brush 12a is in contact with the chuck pin 11c.

In this process, the brush 12a and the rotation portion 12b are in a state in which they can be rotated by the force from outside of wafer cleaning module 12, specifically, in a state in which they can be freely rotated. Therefore, when the brush 12a contacts the chuck pin 11c, as shown by an arrow "$D_2$" of FIG. 3B, the brush 12a and the rotation portion 12b are rotated clockwise by the kinetic energy transmitted from the chuck pin 11c. As a result, the brush 12a can avoid the chuck pin 11c, and fall of the brush 12a and rotation-stop of the wafer 1 can be prevented.

Figure 4A:
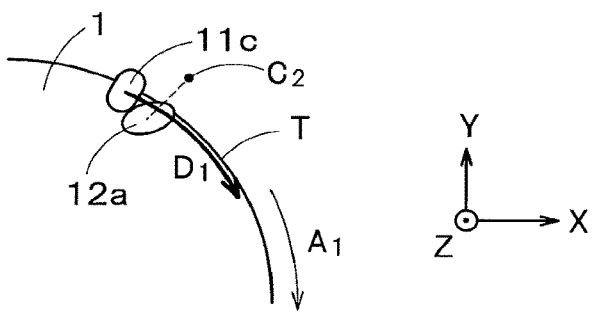
FIGS. 4A and 4B are top views showing another example of contact between the brush and the chuck pins of the first embodiment.
Figure 4B:
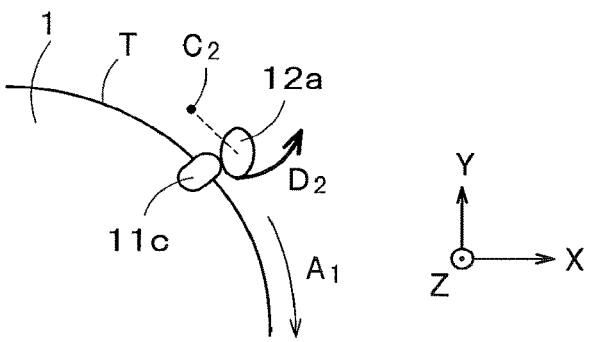

FIGS. 4A and 4B are top views showing another example of contact between the brush 12a and the chuck pins 11c of the first embodiment.

FIG. 4A shows a case where the brush 12a contacts a chuck pin 11c as shown by an arrow "$D_1$" when the brush 12a of the second mode is moved in the vicinity of the circumference "T". In FIG. 4A, when the rotation axis "$C_2$" of the brush 12a is outside of circumference "T", the brush 12a is in contact with the chuck pin 11c.

In this process, the brush 12a and the rotation portion 12b are in a state in which they can be rotated by the force from outside of wafer cleaning module 12, specifically, in a state in which they can be freely rotated. Therefore, when the brush 12a contacts the chuck pin 11c, as shown by an arrow "$D_2$" of FIG. 4B, the brush 12a and the rotation portion 12b are rotated counterclockwise by the kinetic energy transmitted from the chuck pin 11c. As a result, the brush 12a can avoid the chuck pin 11c, and fall of the brush 12a and rotation-stop of the wafer 1 can be prevented.

FIGS. 5A and 5B are top views showing an example of avoidance of contact between the brush 12a and the chuck pins 11c of the first embodiment.

FIG. 5A shows a case where the chuck pin 11c passes through the vicinity of the rotation axis "$C_2$" as shown by an arrow "$D_1$" when the rotation axis "$C_2$" is in the vicinity of the circumference "T". As described above, the wafer cleaning module 12 of the present embodiment retains and rotates the brush 12a so that the rotation axis "$C_2$" does not pass through the bottom surface (contact region) "S" of the brush 12a. Therefore, in FIG. 5A, the brush 12a is not present on the trajectory of the chuck pin 11c. As a result, the brush 12a can avoid the chuck pin 11c (FIG. 5B), and fall of the brush 12a and rotation-stop of the wafer 1 can be prevented.

If the brush 12a is present on the trajectory of the chuck pin 11c in the case of FIG. 5A, the brush 12a contacts the chuck pin 11c, and the brush 12a and the rotation portion 12b rotate clockwise or counterclockwise as shown in FIGS. 3B and 4B.

In this manner, according to the present embodiment, the wafer 1 can be cleaned to the circumference "T" while preventing fall of the brush 12a and rotation-stop of the wafer 1. According to the present embodiment, the brush 12a can be detached from the surface of the wafer 1 by moving the brush 12a in the horizontal direction. As a result, it is possible to prevent the foreign matters from remaining on the wafer circumferential portion "$W_2$" and to prevent the foreign matters attached to the brush 12a from being reattached to the wafer 1 due to pull-up of the brush 12a.

In the present embodiment, the brush 12a is configured so that the brush 12a can be freely rotated by the force that is weaker than the force by which the upper portion "$P_1$" of the brush 12a is detached from the opening "$P_2$" of the rotation portion 12b. Therefore, when the brush 12a contacts the wafer chuck 11c, the brush 12a can be rotated without falling from the rotation portion 12b.

FIG. 6 is a top view for explaining the shapes of the brush 12a and the chuck pins 11c of the first embodiment.

A symbol "$E_1$" represents a point closest to the rotation axis "$C_2$" within the contact region "S". Hereinafter, the point "$E_1$" will be referred to as a closest point. The symbol "$E_2$" represents a point farthest from the rotation axis "$C_2$" within the contact region "S". Hereinafter, the point "$E_2$" will be referred to as a farthest point. FIG. 6 further shows a rotation trajectory "$Z_1$" of the closest point "$E_1$", a rotation trajectory "$Z_2$" of the farthest point "$E_2$", a distance "$R_1$" between the closest point $E_1$ and the rotation axis "$C_2$" (trajectory radius of the closest point "$E_1$"), and a distance "$R_2$" between the farthest point "$E_2$" and the rotation axis "$C_2$" (trajectory radius of the farthest point $E_2$). A symbol "L" represents a straight line connecting the center of the contact region "S" and the rotation axis "$C_2$". A symbol "Q" represents a maximum length of each chuck pin 11c in the direction parallel to the surface of the wafer 1.

The circumference of the contact region "S" of the present embodiment is not a polygonal shape having corner portions, but an elliptical shape having no corner portion. In this manner, the brush 12a is desired to have a shape that has no corner portion in the circumference of the contact region "S". As a result, when the brush 12a contacts the wafer chuck 11c, catching of the corner portions of the brush 12a by the wafer chuck 11c can be restricted. The circumference of the contact region "S" may be a shape other than the ellipse as long as it has no corner portion.

The circumference of each chuck pin 11c is desired to have a shape having no corner portion on the surface of the wafer 1 in the state where the wafer 1 is retained by the wafer retaining module 11. FIG. 6 shows a chuck pin 11c having an oval shape on the surface of the wafer 1. As a result, when the brush 12a contacts the wafer chuck 11c, catching of the brush 12a by the corner portion of the wafer chuck 11c can be restricted. The circumference of the chuck pin 11c may have a shape other than the oval as long as it has no corner portion.

The brush 12a is desired to have a shape with which the closest point "$E_1$" is not positioned on the straight line "L" as shown in FIG. 6. As a result, a long axis and a short axis of the contact region "S" having the elliptical shape are tilted with respect to the straight line "L". In this case, when the brush 12a contacts the wafer chuck 11c, the force tilted with respect to the radial direction or the circumferential direction of the wafer 1 works on the brush 12a from the wafer chuck 11c. As a result, the brush 12a can be easily rotated as shown in FIGS. 3B and 4B.

The distance "$R_1$" between the closest point "$E_1$" and the rotation axis "$C_2$" represents the distance between the contact region "S" and the rotation axis "$C_2$". In the present embodiment, the distance "$R_1$" is set to be longer than half the maximum length "Q" of the chuck pin 11c ($R_1 > Q/2$). As a result, as shown in FIG. 5B, when the rotation axis "$C_2$" is in the vicinity of the circumference "T", the brush 12a can avoid the chuck pin 11c.

FIGS. 7A and 7B are a cross sectional view and a top view showing a structure of a semiconductor manufacturing apparatus of a comparative example of the first embodiment.

The wafer cleaning module 12 of the present comparative example retains and rotates the brush 12a so that the rotation axis "$C_2$" passes through the contact region "S". FIG. 7A shows a state in which the rotation axis "$C_2$" is passing through the contact region "S".

In the present comparative example, the brush 12a cannot avoid the chuck pin 11c as shown in FIGS. 3B, 4B and 5B. Therefore, when the brush 12a contacts the chuck pin 11c, the brush 12a may fall, or the rotation of the wafer 1 may be stopped. On the other hand, according to the present embodiment, the wafer can be cleaned to the circumference "T" while restricting such inconveniences.

The circumferences of the chuck pins 11c of the present comparative example have the shapes having corner portions on the surface of the wafer 1 as shown in FIG. 7B. In this case, the brush 12a may be caught by the corner portions of the wafer chucks 11c. On the other hand, according to the present embodiment, such catching can be restricted.

As described above, the wafer cleaning module 12 of the present embodiment retains and rotates the brush 12a so that the rotation axis "$C_2$" does not pass through the contact region "S". Therefore, the present embodiment makes it possible, by cleaning the vicinity of the circumference "T" of the wafer 1 in the state in which the brush 12a can be rotated by the force from outside of wafer cleaning module 12, to restrict inconveniences such as fall of the brush 12a and rotation-stop of the wafer 1.

Second Embodiment

FIGS. 8A and 8B are cross sectional views showing structures of semiconductor manufacturing apparatuses of a second embodiment.

The wafer cleaning module 12 of FIG. 8A retains two brushes 12a that are separated from each other. The shape and material of each of the brushes 12a are similar to those of the brush 12a of the first embodiment. Symbols "$S_1$" and "$P_1$" represent a contact region and an upper portion of one brush 12a. The upper portion "$P_1$" is inserted in an opening "$P_2$" of the rotation portion 12b. Symbols "$S_2$" and "$P_3$" represent a contact region and an upper portion of the other brush 12a. The upper portion "$P_3$" is inserted in an opening "$P_4$" of the rotation portion 12b. The contact regions "$S_1$" and "$S_2$" are separated from each other. These brushes 12a are disposed so as to sandwich the rotation axis "$C_2$". These brushes 12a are examples of first and second cleaning members. The contact regions "$S_1$" and "$S_2$" are examples of first and second contact regions, respectively.

The wafer cleaning module 12 of the present embodiment retains and rotates the brushes 12a so that the rotation axis "$C_2$" does not pass through the contact regions "$S_1$" and "$S_2$". Therefore, according to the present embodiment, the wafer 1 can be cleaned to the circumference "T" while preventing fall of the brushes 12a and rotation-stop of the wafer 1.

The wafer cleaning module 12 of FIG. 8B corresponds to a modification of the wafer cleaning module 12 of FIG. 8A. A single brush 12a of FIG. 8B has a shape integrating the two brushes 12a of FIG. 8A into one. However the contact regions "$S_1$" and "$S_2$" are separated from each other.

The wafer cleaning module 12 of the present modification also retains and rotates the brush 12a so that the rotation axis "$C_2$" does not pass through the contact regions "$S_1$" and "$S_2$". Therefore, according to the present modification, the wafer 1 can be cleaned to the circumference "T" while preventing fall of the brush 12a and rotation-stop of the wafer 1.

FIGS. 9A and 9B are top views showing an example of contact between the brushes 12a and the chuck pins 11c of the second embodiment. FIGS. 9A and 9B show the semiconductor manufacturing apparatus of FIG. 8A or 8B.

FIG. 9A shows a case where one brush 12a of the second mode contacts a chuck pin 11c as shown by an arrow "$D_1$" when the brush 12a moves in the vicinity of the circumference "T". In FIG. 9A, when the rotation axis "$C_2$" is in the inner side of the circumference "T", the brush 12a is in contact with the chuck pin 11c.

In this process, the brushes 12a and the rotation portion 12b are in a state in which they can be rotated by the force from outside of wafer cleaning module 12, specifically, in a state in which they can be freely rotated. Therefore, when a brush 12a contacts a chuck pin 11c, as shown by an arrow "$D_2$" of FIG. 9B, the brush 12a and the rotation portion 12b are rotated clockwise by the kinetic energy transmitted from the chuck pin 11c. As a result, the brush 12a can avoid the chuck pin 11c, and fall of the brush 12a and rotation-stop of the wafer 1 can be prevented.

This is similar to the operations shown in FIGS. 3A and 3B. The operations shown in FIGS. 4A and 4B and FIGS. 5A and 5B are also applicable to the second embodiment.

As described above, the wafer cleaning module 12 of the present embodiment retains and rotates the brushes 12a so that the rotation axis "$C_2$" does not pass through the contact regions "$S_1$" and "$S_2$". Therefore, according to the present embodiment, inconveniences such as fall of the brushes 12a and rotation-stop of the wafer 1 can be restricted, as similar to the first embodiment.

According to the present embodiment, since the wafer cleaning module 12 has the plurality of contact regions "$S_1$" and "$S_2$", the balance of the force that acts on the wafer cleaning module 12 on the wafer 1 can be improved, and the stability of the position of the wafer cleaning module 12 can be improved.

The wafer cleaning module 12 of the present embodiment may have "N" contact regions where "N" is an integer of 3 or more. In this case, the contact regions may be provided for the "N" brushes 12a or for the brushes 12a that are less than "N".

Third Embodiment

Figures 10A, 10B, 10C:
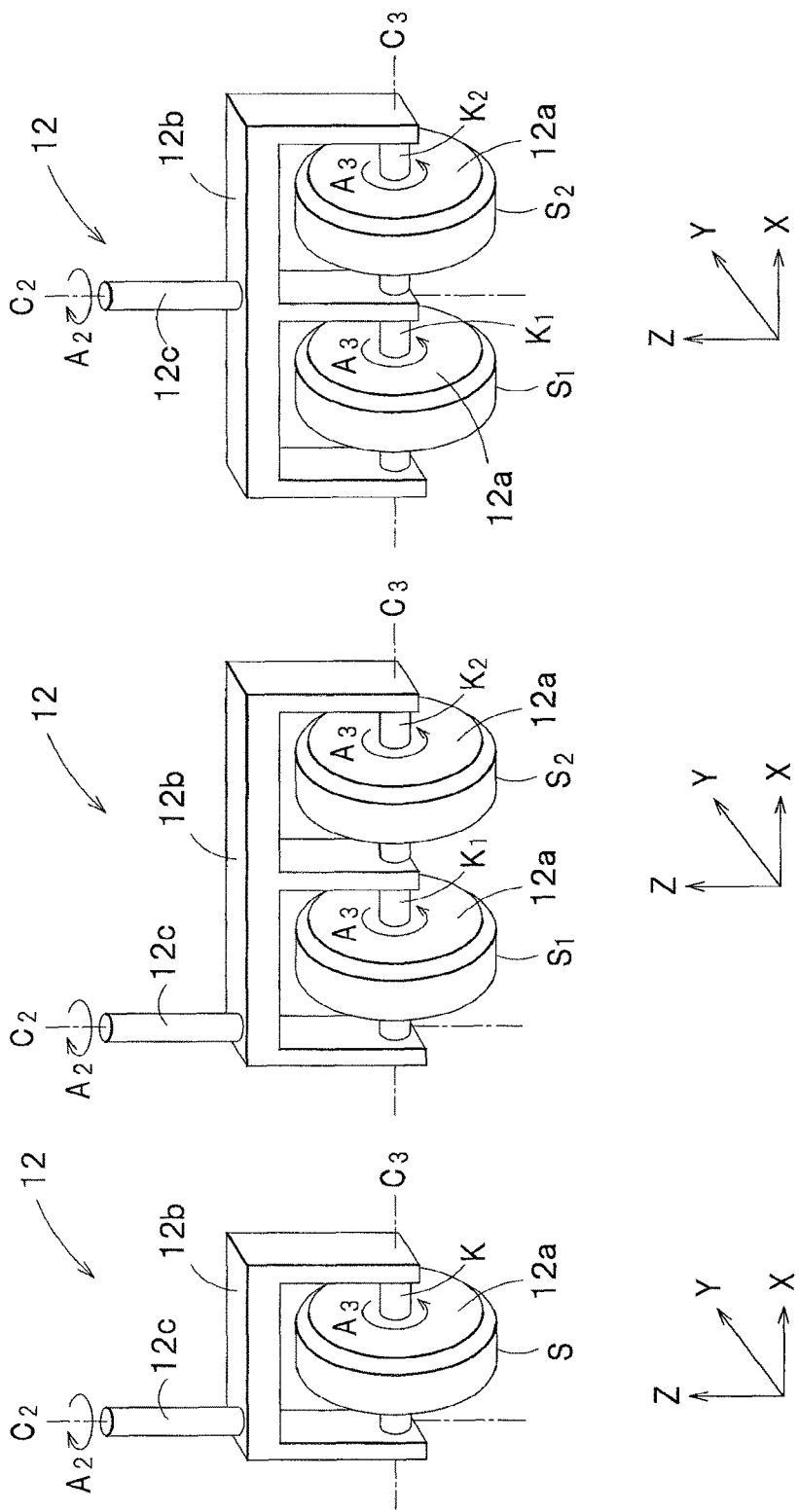
FIGS. 10A to 10C are perspective views showing structures of wafer cleaning modules of a third embodiment.

FIGS. 10A to 10C are perspective views showing structures of wafer cleaning modules 12 of a third embodiment.

The wafer cleaning module 12 of FIG. 10A retains a brush 12a having a tire shape. An example of the brush 12a is a sponge brush. The brush 12a is rotatably and detachably attached to a shaft "K" of the rotation portion 12b.

A symbol "$C_3$" represents a rotation axis of a case in which the brush 12a is rotated around the shaft "K". The brush 12a rotates around the rotation axis "C₃" as shown by an arrow "A₃". The rotation axis "C₃" of the present embodiment is perpendicular to the "Z" direction and is passing through the center of the shaft "K". The rotation axis "C₃" is an example of a second rotation axis. In either one of the first and second modes, the brush 12a of the present embodiment may be intentionally rotated around the rotation axis "C₃" or may be caused to be in a state in which the brush 12a can be freely rotated around the rotation axis "C₃".

The brush 12a, the rotation portion 12b and the first connecting portion 12c are rotated around a rotation axis "C₂" as shown by an arrow "A₂". The rotation axis "C₂" of the present embodiment is parallel to the "Z" direction and is passing through the center of the first connecting portion 12c. The rotation axis "C₂" is an example of a first rotation axis. The brush 12a of the present embodiment is rotated around the rotation axis "C₂" by the rotation portion 12b in the first mode and can be freely rotated around the rotation axis "C₂" in the second mode.

The wafer cleaning module 12 of the present embodiment retains and rotates the brush 12a so that the rotation axis "C₂" does not pass through the contact region "S". Therefore, according to the present embodiment, the wafer 1 can be cleaned to the circumference "T" while preventing fall of the brush 12a and rotation-stop of the wafer 1.

The wafer cleaning modules 12 of FIGS. 10B and 10C correspond to modifications of the wafer cleaning module 12 of FIG. 10A. Each of the wafer cleaning modules 12 of FIGS. 10B and 10C is retaining two brushes 12a having tire shapes. The shape and material of each of the brushes 12a are similar to the brush 12a of FIG. 10A. These brushes 12a are rotatably and detachably attached to shafts "K₁" and "K₂" of the rotation portion 12b, respectively.

Each of the wafer cleaning modules 12 of these modifications retains and rotates the brushes 12a so that the rotation axis "C₂" does not pass through the contact regions "S₁" and "S₂" of the brushes 12a. Therefore, according to these modifications, the wafer 1 can be cleaned to the circumference "T" while preventing fall of the brushes 12a and rotation-stop of the wafer 1.

In FIGS. 10B and 10C, the two brushes 12a may be integrated into one, as similar to FIG. 8B. The wafer cleaning module 12 of the present embodiment may retain three or more brushes 12a having tire shapes.

While certain embodiments have been described, these embodiments have been presented by way of example only, and are not intended to limit the scope of the inventions. Indeed, the novel apparatuses and methods described herein may be embodied in a variety of other forms; furthermore, various omissions, substitutions and changes in the form of the apparatuses and methods described herein may be made without departing from the spirit of the inventions. The accompanying claims and their equivalents are intended to cover such forms or modifications as would fall within the scope and spirit of the inventions.

The invention claimed is:

1. A semiconductor manufacturing apparatus comprising:
   a wafer retaining module configured to retain a wafer by a chuck pin that fixes the wafer by vertically sandwiching an edge of the wafer and to rotate the wafer;
   a wafer cleaning module configured to retain a cleaning member for cleaning a surface of the wafer, and including a movement portion configured to move the cleaning member from an inner side of a circumference of the wafer to an outer side of the circumference of the wafer, and a rotation portion configured to continuously rotate the cleaning member around a first rotation axis that is perpendicular to the surface of the wafer, the wafer cleaning module cleaning the surface of the wafer by moving the cleaning member on the surface of the wafer while the cleaning member contacts the wafer and rotates; and
   a controller configured to control an operation of the wafer cleaning module;
   wherein
   the wafer cleaning module retains and rotates the cleaning member so that the first rotation axis does not pass through a contact region of the cleaning member with respect to the wafer,
   the wafer cleaning module detaches the cleaning member from the surface of the wafer by moving the cleaning member from the inner side of the circumference of the wafer to the outer side of the circumference of the wafer,
   the controller sets a first mode in which the cleaning member is rotated by the wafer cleaning module, and a second mode in which rotation of the cleaning member by the wafer cleaning module is stopped so that the cleaning member is rotated by force from outside of the wafer cleaning module, and
   the controller sets the wafer cleaning module to the first mode when a first portion of the wafer is to be cleaned, and sets the wafer cleaning module to the second mode when a second portion of the wafer is to be cleaned, the second portion being on an circumferential side of the wafer compared to the first portion.

2. The apparatus of claim 1, wherein the cleaning member has a shape that has no corner portion in a circumference of the contact region.

3. The apparatus of claim 1, wherein the cleaning member has a shape in which a point closest to the first rotation axis in the contact region is not positioned on a straight line that connects a center of the contact region and the first rotation axis.

4. The apparatus of claim 1, wherein a circumference of the chuck pin has a shape that has no corner portion on the surface of the wafer in a state where the wafer is retained by the wafer retaining module.

5. The apparatus of claim 1, wherein
   the rotation portion is configured to retain the cleaning member and to rotate the cleaning member around the first rotation axis; and
   the movement portion is connected to the rotation portion and configured to move the cleaning member on the surface of the wafer by moving the rotation portion.

6. The apparatus of claim 1, wherein
   the wafer cleaning module retains, as the cleaning member, first and second cleaning members separated from each other; and
   the first and second cleaning members respectively have, as the contact region, first and second contact regions separated from each other.

7. The apparatus of claim 1, wherein the cleaning member has, as the contact region, first and second contact regions separated from each other.

8. The apparatus of claim 1, wherein the wafer cleaning module retains the cleaning member having a tire shape.

9. The apparatus of claim 8, wherein the cleaning member having the tire shape is retained by the wafer cleaning module so as to be rotated around a second rotation axis that is perpendicular to the first rotation axis.

10. A semiconductor manufacturing apparatus comprising:

a wafer retaining module configured to retain a wafer by a chuck pin that fixes the wafer by vertically sandwiching an edge of the wafer and to rotate the wafer;

a wafer cleaning module configured to retain a cleaning member for cleaning a surface of the wafer, and including a movement portion configured to move the cleaning member from an inner side of a circumference of the wafer to an outer side of the circumference of the wafer, and a rotation portion configured to continuously rotate the cleaning member around a first rotation axis that is perpendicular to the surface of the wafer, the wafer cleaning module cleaning the surface of the wafer by moving the cleaning member on the surface of the wafer while the cleaning member contacts the wafer and rotates; and a controller configured to control an operation of the wafer cleaning module;

wherein the wafer cleaning module retains and rotates the cleaning member so that the first rotation axis does not pass through a contact region of the cleaning member with respect to the wafer, the wafer cleaning module detaches the cleaning member from the surface of the wafer by moving the cleaning member from the inner side of the circumference of the wafer to the outer side of the circumference of the wafer, the controller sets a first mode in which the cleaning member is rotated by the wafer cleaning module, and a second mode in which rotation of the cleaning member by the wafer cleaning module is stopped so that the cleaning member is rotated by force from outside of the wafer cleaning module, and the wafer cleaning module detaches the cleaning member from the surface of the wafer by moving the cleaning member from the inner side of the circumference of the wafer to the outer side of the circumference of the wafer in the second mode.

11. A semiconductor manufacturing apparatus comprising:

a wafer retaining module configured to retain a wafer by a chuck pin that fixes the wafer by vertically sandwiching an edge of the wafer and to rotate the wafer; and a wafer cleaning module configured to retain a cleaning member for cleaning a surface of the wafer, and including a movement portion configured to move the cleaning member from an inner side of a circumference of the wafer to an outer side of the circumference of the wafer, and a rotation portion configured to continuously rotate the cleaning member around a first rotation axis that is perpendicular to the surface of the wafer, the wafer cleaning module cleaning the surface of the wafer by moving the cleaning member on the surface of the wafer while the cleaning member contacts the wafer and rotates; and wherein the wafer cleaning module retains and rotates the cleaning member so that the first rotation axis does not pass through a contact region of the cleaning member with respect to the wafer, the wafer cleaning module detaches the cleaning member from the surface of the wafer by moving the cleaning member from the inner side of the circumference of the wafer to the outer side of the circumference of the wafer, and a distance between an intersection point between an extended line of the first rotation axis and the surface of the wafer and the contact region is longer than half a maximum length of the chuck pin in a direction parallel to the surface of the wafer.

* * * * *